United States Patent
Wang et al.

(10) Patent No.: US 12,155,349 B2
(45) Date of Patent: Nov. 26, 2024

(54) INTELLIGENT SOLAR PHOTOVOLTAIC COMPONENT

(71) Applicant: HENGDIAN GROUP DMEGC MAGNETICS CO., LTD, Jinhua (CN)

(72) Inventors: Tingting Wang, Jinhua (CN); Hailin Yin, Jinhua (CN); Lin Zhao, Jinhua (CN)

(73) Assignee: HENGDIAN GROUP DMEGC MAGNETICS CO., LTD, Zhejiang (CN)

( * ) Notice: Subject to any disclaimer, the term of this patent is extended or adjusted under 35 U.S.C. 154(b) by 0 days.

(21) Appl. No.: 17/760,065

(22) PCT Filed: May 7, 2022

(86) PCT No.: PCT/CN2022/091405
§ 371 (c)(1),
(2) Date: Aug. 3, 2022

(87) PCT Pub. No.: WO2023/077759
PCT Pub. Date: May 11, 2023

(65) Prior Publication Data
US 2024/0186946 A1    Jun. 6, 2024

(30) Foreign Application Priority Data
Nov. 8, 2021   (CN) .......................... 202122719552.6

(51) Int. Cl.
*H02S 40/34*   (2014.01)
*H02S 40/38*   (2014.01)
(Continued)

(52) U.S. Cl.
CPC .............. *H02S 40/34* (2014.12); *H02S 40/38* (2014.12); *H01L 31/02021* (2013.01);
(Continued)

(58) Field of Classification Search
CPC .......... H02S 40/34; H02S 40/38; H02S 50/00; H01L 31/02021; H01L 31/042; H01L 31/044; H02H 7/20; H02H 11/00
See application file for complete search history.

(56) References Cited

U.S. PATENT DOCUMENTS

| | | | |
|---|---|---|---|
| 2011/0271999 A1* | 11/2011 | Almogy | F24S 40/55 136/246 |
| 2016/0061881 A1* | 3/2016 | Zhang | G01R 31/129 324/536 |
| 2022/0021335 A1* | 1/2022 | Askan | H02S 40/34 |

FOREIGN PATENT DOCUMENTS

| | | |
|---|---|---|
| CN | 102593217 A | 7/2012 |
| CN | 104078524 A | 10/2014 |
| (Continued) | | |

OTHER PUBLICATIONS

International Search Report for PCT Application No. PCT/CN2022/091405, mailed Jul. 12, 2022.
(Continued)

*Primary Examiner* — Michael Y Sun
(74) *Attorney, Agent, or Firm* — Andrus Intellectual Property Law, LLP

(57) ABSTRACT

An intelligent solar photovoltaic component includes a solar photovoltaic component body and an intelligent junction box located on the solar photovoltaic component body. The intelligent junction box includes multiple solar controllers in communication with one another. Multiple battery strings in the solar photovoltaic component body are in a one-to-one correspondence electrically connected to connection terminals of solar controllers via busbars.

11 Claims, 3 Drawing Sheets

(51) Int. Cl.
 H01L 31/02 (2006.01)
 H01L 31/042 (2014.01)
 H01L 31/044 (2014.01)
 H02H 7/20 (2006.01)
 H02H 11/00 (2006.01)
 H02S 50/00 (2014.01)

(52) U.S. Cl.
 CPC .......... *H01L 31/042* (2013.01); *H01L 31/044* (2014.12); *H02H 7/20* (2013.01); *H02H 11/00* (2013.01); *H02S 50/00* (2013.01)

(56) References Cited

FOREIGN PATENT DOCUMENTS

| | | |
|---|---|---|
| CN | 105322884 A | 2/2016 |
| CN | 106711259 A | 5/2017 |
| CN | 206259900 U | 6/2017 |
| CN | 106972074 A | 7/2017 |
| CN | 208874539 U | 5/2019 |
| CN | 213636011 U | 7/2021 |
| CN | 113224192 A | 8/2021 |
| CN | 216213496 U | 4/2022 |
| DE | 202020103675 U1 | 7/2020 |
| JP | 2017169443 A | 9/2017 |

OTHER PUBLICATIONS

Notice of Reasons for Refusal for Japanese Patent Application No. 2022-543746, dated Dec. 7, 2023.
Extended European Search Report for European Patent Application No. 22737697.7, dated Feb. 16, 2024.

\* cited by examiner

006E
INTELLIGENT SOLAR PHOTOVOLTAIC COMPONENT

CROSS-REFERENCE TO RELATED APPLICATIONS

This is a national stage application filed under 37 U.S.C. 371 based on International Patent Application No. PCT/CN2022/091405, filed on May 7, 2022, which claims priority to Chinese Patent Application No. 202122719552.6 filed with the China National Intellectual Property Administration (CNIPA) on Nov. 8, 2021, the disclosure of which is incorporated herein by reference in its entirety.

TECHNICAL FIELD

The present application relates to the technical field of solar photovoltaic, for example, an intelligent solar photovoltaic component.

BACKGROUND

A solar photovoltaic component is not only the core part, but also the most important part of a solar power system. The solar photovoltaic component has the function of converting light into electricity, and sending the electricity to a battery for storage or driving the load to operate.

A diode junction box is mounted in a conventional solar photovoltaic component. To reduce the risk of hot spot failure in the solar photovoltaic component, an intelligent junction box can be mounted in the conventional solar photovoltaic component, thereby achieving maximum power point tracking to the solar photovoltaic component. Here, the solar photovoltaic component mounted with the intelligent junction box can be called as an intelligent solar photovoltaic component.

SUMMARY

The present application provides an intelligent solar photovoltaic component. The intelligent solar photovoltaic component includes a solar photovoltaic component body and an intelligent junction box located on the solar photovoltaic component body. The intelligent junction box includes multiple solar controllers in communication with one another.

Multiple battery strings in the solar photovoltaic component body are in a one-to-one correspondence electrically connected to connection terminals of the multiple solar controllers via busbars.

Figure 1:
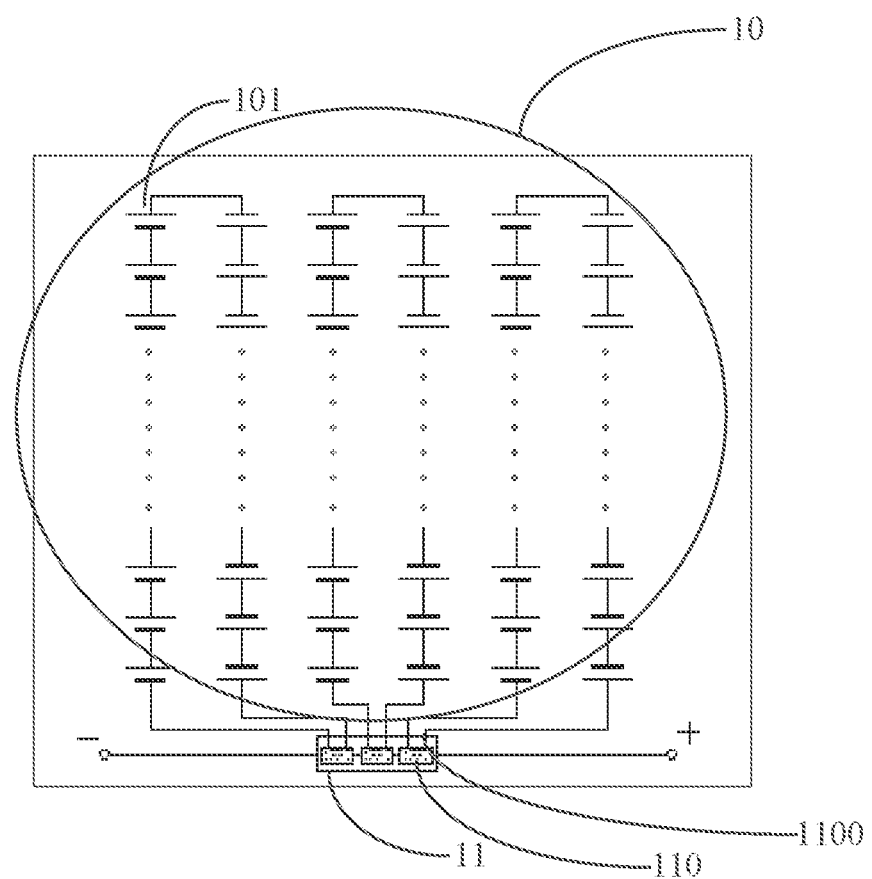
FIG. 1 is a view illustrating an intelligent solar photovoltaic component according to an embodiment of the present application.

REFERENCE LIST 10 solar photovoltaic component body
11 intelligent junction box
101 battery string
102 busbar
103 interconnection strip
110 solar controller
1100 connection terminal

DETAILED DESCRIPTION

Solutions in embodiments of the present application will be described through the embodiments below and in conjunction with drawings in the embodiments of the present application. It is to be understood that the embodiments described herein are intended to explain the present application.

Figure 2:
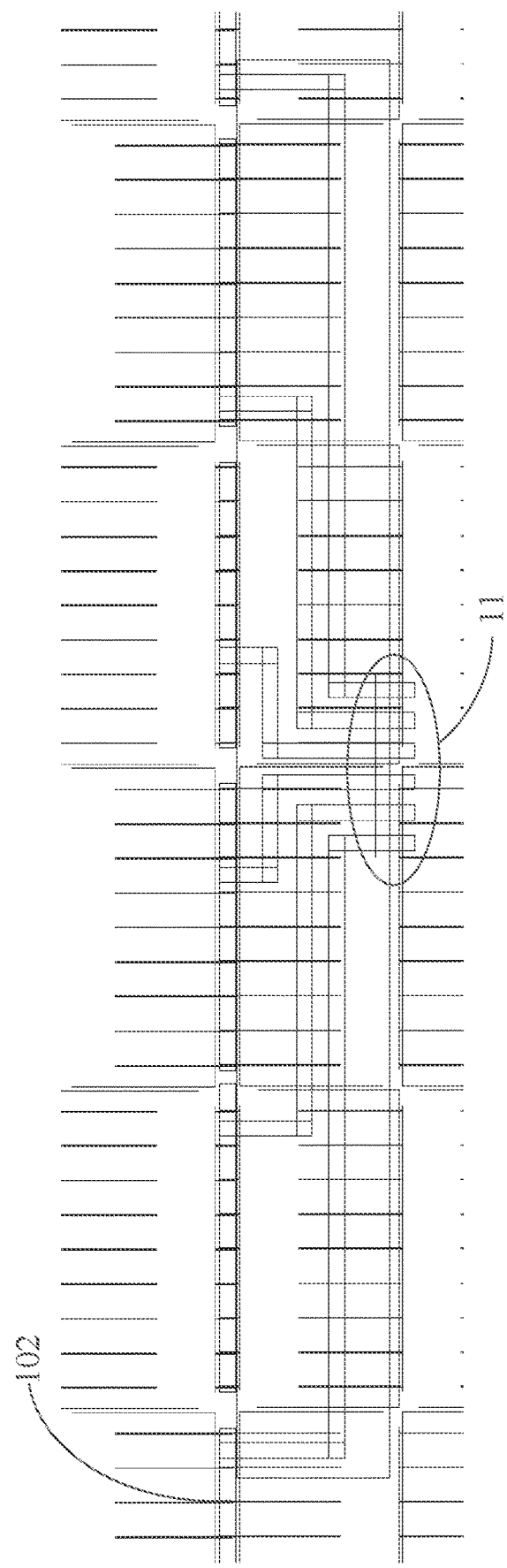
FIG. 2 is a schematic diagram of a bus structure of an intelligent solar photovoltaic component according to an embodiment of the present application.
Figure 3:
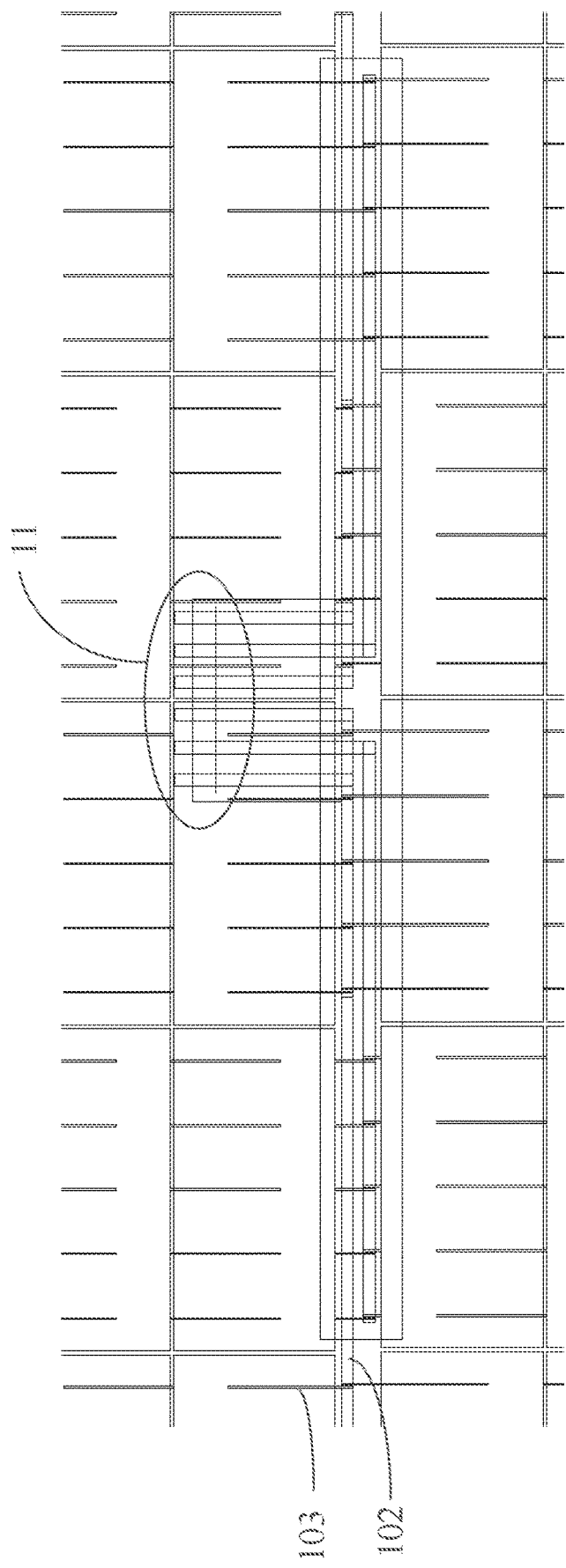
FIG. 3 is another schematic diagram of a bus structure of an intelligent solar photovoltaic component according to an embodiment of the present application.

FIG. 1 is a view illustrating an intelligent solar photovoltaic component according to an embodiment of the present application. Referring to FIGS. 1 to 3, the intelligent solar photovoltaic component may include a solar photovoltaic component body 10 and an intelligent junction box 11 located on the solar photovoltaic component body 10. The intelligent junction box 11 including multiple solar controllers 110 in communication with one another. The multiple battery strings 101 in the solar photovoltaic component body 10 are in a one-to-one correspondence electrically connected to a connection terminals 1100 of the multiple solar controllers 110 via busbars 202.

In one embodiment, the intelligent junction box 11 is formed on a backplate of the solar photovoltaic component body 10. The intelligent junction box 11 includes a plurality of solar controllers 110 (maximum power point tracking, MPPT). Each of the multiple battery strings 101 is electrically connected to a respective one of the connection terminals 1100 of the multiple solar controllers 110, and whether the battery string 101 is in a normal operation state is mainly detected in a manner that the solar controller 110 detects a terminal voltage of the battery string 101. Once the solar controller 110 detects that the voltage of one battery string 101 is different, it is considered that a hot spot effect occurs on the battery string 101 having the low voltage, the output current of the battery string 101 having the low voltage becomes smaller, and the other battery strings 101 connected in series to the battery string 101 are subject to the low current. The intelligent junction box 11 adjusts and changes the output voltage of the solar photovoltaic component body 10 in a manner that the multiple solar controllers 110 detect voltages of the multiple battery strings 101. Moreover, output currents of the battery strings change until the output power of the solar photovoltaic component body 10 reaches a maximum point.

In the present embodiment, a conventional diode junction box may be replaced with the intelligent junction box 11. The multiple battery strings 101 in the solar photovoltaic component body 10 are encapsulated between the panel and the backplate. Electric energy of the multiple battery strings 101 is led out of the backplate via the busbars 102, and each of the multiple battery strings 101 is electrically connected to a respective one of the connection terminals 1100 of the multiple solar controllers 110 in the intelligent junction box 11.

In an optional embodiment, the busbars 102 of the multiple battery strings 101 may be conducted inside the solar photovoltaic component body 10 to lead the electric energy of the multiple battery strings 101 to the connection terminals 1100 in the intelligent junction box 11. The solution in which the electric energy is led out by means of changing the layout of the busbars 102 inside the solar photovoltaic component body 10 is described below.

Optionally, the busbars 102 of at least two battery strings 101 in the solar photovoltaic component body 10 are misaligned inside the solar photovoltaic component body 10. Optionally, referring to FIG. 2 (FIG. 2 illustrates that the solar photovoltaic component body 10 includes six battery strings 101), one misaligned layout of the busbars 102 may be that the busbars 102 of the at least two battery strings 101 inside the solar photovoltaic component body 10 are misaligned by means of bending and detouring, and an insulating sheet is provided on each portion of one busbar 102 where the one busbar 102 overlaps each battery string 101. The bending angle of each busbar 102 may be any angle. In an optional embodiment, the bending angle of the busbar 102 may be 90 degrees. Optionally, the insulating sheet may be any one of insulating tape, insulating paint, or insulating plastic. That is, the busbar 102 of each battery string 101 may be laterally conducted, then bended 90 degrees to be vertically conducted, then bent 90 degrees to be laterally conducted, and then bent 90 degrees to be vertically conducted, until the busbar 102 is connected to the connection terminal 1100 in the intelligent junction box 11. It should be noted that the detouring layout shown in FIG. 2 is merely an example, and the busbars 102 may also be in another bending and detouring layout as long as the busbars 102 of the multiple battery strings 101 are misaligned by means of bending and detouring.

The busbars of the multiple battery strings 101 lead the electric energy of the multiple battery strings 101 to the intelligent junction box 11 by means of bending and detouring, so that the process delamination, air bubbles and even reliability problem caused by the height generated by the superposition of multi-layer insulating sheets of the busbars when the electric energy is led out can be reduced. Moreover, positioning and welding of the bending and detouring of the busbars can be completed off the production line, not affecting the tempo of the production line of the solar photovoltaic component body 10.

Optionally, referring to FIG. 3, another misaligned layout of the busbars 102 may be that interconnection strips 103 (i.e., solder ribbons) of part of the battery strings 101 are reserved so that the busbars 102 of part of, or all of the battery strings 101 are misaligned. Optionally, one end of the interconnection strips 103 of at least two battery strings 101 inside the solar photovoltaic component body 10 has a different reserved length in the same direction with respect to the smart junction box 11, and the upper layer of each interconnection strip 103 reserved on each battery string 101 is correspondingly welded to the busbar 102 electrically connected to a respective one of the connection terminals 1100 of the multiple solar controllers 110. Each busbar 102 may be laid out in the shape of an inverted "L". Optionally, an insulating sheet is provided on each portion of the plurality of battery strings 102 where the plurality of battery strings 102 overlap one another. Optionally, the insulating sheet may be any one of insulating tape, insulating paint, or insulating plastic.

It is assumed that the battery strings shown in FIG. 3 are a battery string 1, a battery string 2, a battery string 3, a battery string 4, a battery string 5, and a battery string 6 from left to right. It can be seen from FIG. 3 that the busbars 102 of the battery string 1 and the battery string 2 are laterally misaligned, the busbars 102 of the battery string 5 and the battery string 6 are laterally misaligned, the busbars 102 of the battery string 1 and the battery string 3 laterally partially overlap, and the busbars 102 of the battery string 4 and the battery string 6 laterally partially overlap. The insulating sheets are formed on the preceding overlapping portions. It should be noted that the misaligned layout of the busbars shown in FIG. 3 is merely an example, and the busbars may be in another misaligned layout as long as the misaligned layout of the busbars is achieved by reserving the interconnection strips of at least two battery strings with different lengths.

Such method can reduce the usage amount of the busbars, and can also reduce the process and reliability problems caused by the height generated by the superposition of multi-layer busbars and multi-layer insulating sheets between the busbars.

Next, another solution in which the electric energy of the multiple battery strings 101 is led out of the backplate and accessed to the intelligent junction box 11 via the busbars 102 is described below. Such solution does not require the complicated busbar wiring inside the solar photovoltaic component body 10.

Optionally, multiple external connection terminals are disposed on two sides of the intelligent junction box 11, respectively. The busbars 102 of the battery strings 101 close to an outer side of the solar photovoltaic component body 10 directly pass through a backplate without being conducted inside the solar photovoltaic component body 10, and are in a one-to-one correspondence electrically connected to connection terminals 1100 inside the intelligent junction box 11 via the multiple external connection terminals. The busbars 102 of the battery strings 101 in the middle of the solar photovoltaic component body 10 directly pass through the backplate without being conducted inside the solar photovoltaic component body 10, and are in a one-to-one correspondence electrically connected to idle connection terminals 1100 inside the intelligent junction box 11.

In this embodiment, a hole may be opened on the backplate of the solar photovoltaic component body 10, and the hole may be opened in the middle of adjacent battery strings 101. In this manner, the busbars 102 of the battery strings 101 on two sides of the solar photovoltaic component body 10 may be directly led out from the hole and accessed to the external connection terminals, and each of the external connection terminals is electrically connected to a respective one of the connection terminals 1100 in the intelligent junction box 11 via a cable. The busbars 102 of the battery strings 101 located in the middle of the solar photovoltaic component body 10 may also be led out from the hole closest to the busbar 102, and accessed to the idle connection terminals 1100 in the intelligent junction box 10 so that the electric energy of all of the battery strings 101 can be led out.

In this manner, the external connection terminals are formed on the backplate of the solar photovoltaic component body 10, and the electric energy of the multiple battery strings 101 is led out into the intelligent junction box 11 in the external connection manner, thereby achieving the effect of leading out the electric energy without complicatedly wiring of the busbars inside the solar photovoltaic component body.

The intelligent solar photovoltaic component provided by the embodiments of the present application includes a solar photovoltaic component body and an intelligent junction box located on the solar photovoltaic component body. The intelligent junction box includes multiple solar controllers in communication with one another. Multiple battery strings in the solar photovoltaic component body are in a one-to-one correspondence electrically connected to connection terminals of the multiple solar controllers via busbars, thereby detecting the voltage of each battery string in real time via the multiple solar controllers, dynamically adjusting and changing the output voltage and the output current of the solar photovoltaic component body, and achieving the maximum power output of the solar photovoltaic component body. Moreover, the intelligent junction box can be directly connected to an internal circuit of the solar photovoltaic component body via the busbars, and does not need to be connected to the internal circuit of the solar photovoltaic component body via a diode junction box, reducing the cable connection and connector connection between the diode junction box and the intelligent junction box, and reducing the power loss caused by the connector connection and the line loss. Moreover, various electric energy leading out solutions of the battery strings are provided, for example, the electric energy of the multiple battery strings is led out to the intelligent junction box in the manner in which the busbars of the multiple battery strings are misaligned by means of bending and detouring, in the manner in which the busbars are misaligned by means of reserving the interconnection strips of the at least two battery strings with different lengths, and in the manner of wiring on the backplate of the solar photovoltaic component body.

What is claimed is:

1. An intelligent solar photovoltaic component, comprising:
   a solar photovoltaic component body and an intelligent junction box located on the solar photovoltaic component body, wherein the intelligent junction box comprises a plurality of solar controllers in communication with one another; and
   a plurality of battery strings in the solar photovoltaic component body are in a one-to-one correspondence electrically connected to connection terminals of the plurality of solar controllers via busbars;
   wherein busbars of at least two battery strings of the plurality of battery strings are misaligned inside the solar photovoltaic component body;
   wherein one end of interconnection strips of the at least two battery strings has a different reserved length in a same direction with respect to the intelligent junction box, and an upper layer of an interconnection strip reserved on each of the plurality of battery strings is correspondingly welded to a busbar electrically connected to a respective one of the connection terminals of the plurality of solar controllers.

2. The intelligent solar photovoltaic component of claim 1, wherein the busbars of the at least two battery strings are detoured from each other and bent to be misaligned.

3. The intelligent solar photovoltaic component of claim 2, wherein a bending angle of each of the busbars is 90 degrees.

4. The intelligent solar photovoltaic component of claim 2, wherein an insulating sheet is provided on each portion of one busbar where the one busbar overlaps each of the plurality of battery strings.

5. The intelligent solar photovoltaic component of claim 1, wherein an insulating sheet is provided on each portion of the plurality of battery strings where the plurality of battery strings overlap one another.

6. The intelligent solar photovoltaic component of claim 4, wherein the insulating sheet is one of insulating tape, insulating paint, or insulating plastic.

7. The intelligent solar photovoltaic component of claim 1, wherein a plurality of external connection terminals are disposed on two sides of the intelligent junction box, respectively; and
   the busbars of the battery strings close to an outer side of the solar photovoltaic component body directly pass through a backplate without being conducted inside the solar photovoltaic component body, and are in a one-to-one correspondence electrically connected to connection terminals inside the intelligent junction box via the plurality of external connection terminals, and the busbars of the battery strings in a middle of the solar photovoltaic component body directly pass through the backplate without being conducted inside the solar photovoltaic component body, and are in a one-to-one correspondence electrically connected to idle connection terminals inside the intelligent junction box.

8. The intelligent solar photovoltaic component of claim 7, wherein each of the plurality of external connection terminals is electrically connected to a respective one of the connection terminals inside the intelligent junction box via a cable.

9. The intelligent solar photovoltaic component of claim 1, wherein the insulating sheet is one of insulating tape, insulating paint, or insulating plastic.

10. An intelligent solar photovoltaic component, comprising:
    a solar photovoltaic component body and an intelligent junction box located on the solar photovoltaic component body, wherein the intelligent junction box comprises a plurality of solar controllers in communication with one another; and
    a plurality of battery strings in the solar photovoltaic component body are in a one-to-one correspondence electrically connected to connection terminals of the plurality of solar controllers via busbars;
    a plurality of external connection terminals are disposed on two sides of the intelligent junction box, respectively; and
    the busbars of the battery strings close to an outer side of the solar photovoltaic component body directly pass through a backplate without being conducted inside the solar photovoltaic component body, and are in a one-to-one correspondence electrically connected to connection terminals inside the intelligent junction box via the plurality of external connection terminals, and the busbars of the battery strings in a middle of the solar photovoltaic component body directly pass through the backplate without being conducted inside the solar photovoltaic component body, and are in a one-to-one correspondence electrically connected to idle connection terminals inside the intelligent junction box.

11. The intelligent solar photovoltaic component of claim 10, wherein each of the plurality of external connection terminals is electrically connected to a respective one of the connection terminals inside the intelligent junction box via a cable.

* * * * *